United States Patent [19]

Chang et al.

[11] 4,307,179
[45] Dec. 22, 1981

[54] PLANAR METAL INTERCONNECTION SYSTEM AND PROCESS

[75] Inventors: Kenneth Chang, Hopewell Junction; George T. Chiu, Wappingers Falls, both of N.Y.; Anthony Hoeg, Jr., Cary, N.C.; Linda H. Lee, Poughkeepsie, N.Y.

[73] Assignee: International Business Machines Corporation, Armonk, N.Y.

[21] Appl. No.: 165,537

[22] Filed: Jul. 3, 1980

[51] Int. Cl.³ .............................................. G03C 5/00
[52] U.S. Cl. ................................... 430/314; 156/643; 156/646; 156/656; 156/659.1; 156/661.1; 204/192 E; 430/316; 430/317; 430/318; 430/323; 430/324
[58] Field of Search ............... 430/314, 316, 317, 318, 430/323, 324; 156/643, 646, 655, 656, 659.1, 661.1; 204/192 E; 357/73

[56] References Cited

U.S. PATENT DOCUMENTS

| | | | |
|---|---|---|---|
| 2,559,389 | 7/1951 | Beeber et al. | 41/43 |
| 3,395,057 | 7/1968 | Fick | 156/3 |
| 3,506,506 | 4/1970 | Pennebaker, Jr. | 156/3 |
| 3,544,400 | 12/1970 | Deutsch | 156/13 |
| 3,700,497 | 10/1972 | Epifano et al. | 117/212 |
| 3,715,250 | 2/1973 | Altman et al. | 156/22 |
| 3,820,994 | 6/1974 | Lindberg et al. | 96/36 |
| 3,837,907 | 9/1974 | Berglund et al. | 156/659.1 X |
| 3,844,831 | 10/1974 | Cass et al. | 117/212 |
| 3,846,166 | 11/1974 | Saiki et al. | 117/212 |
| 3,849,136 | 11/1974 | Grebe | 96/36.2 |
| 3,873,361 | 3/1975 | Franco et al. | 117/212 |
| 3,976,524 | 8/1976 | Feng | 430/317 X |
| 3,982,943 | 9/1976 | Feng et al. | 96/38.4 |
| 3,985,597 | 10/1976 | Zielinski | 156/11 |
| 3,991,231 | 11/1976 | Trausch | 427/96 |
| 4,004,044 | 1/1977 | Franco et al. | 427/43 |
| 4,025,411 | 5/1977 | Hom-Ma et al. | 204/192 E |
| 4,035,276 | 7/1977 | Havas et al. | 204/192 EC |
| 4,038,110 | 7/1977 | Feng | 357/73 X |
| 4,040,891 | 8/1977 | Chang et al. | 156/651 |
| 4,040,893 | 8/1977 | Ghezzo | 156/659 |
| 4,057,659 | 11/1977 | Pammer et al. | 427/89 |
| 4,076,575 | 2/1978 | Chang | 156/656 |
| 4,098,637 | 7/1978 | Bell | 156/644 |
| 4,113,550 | 9/1978 | Saiki et al. | 156/656 |
| 4,152,195 | 5/1979 | Bahrle et al. | 156/656 |
| 4,184,909 | 1/1980 | Chang et al. | 156/659.1 X |

OTHER PUBLICATIONS

J. J. Colacino and T. A. Bartush, "Removal of Quartz Spikes Over Metal Lands," IBM TDB, vol. 20, No. 4, Sep. 1977, p. 1381.

Primary Examiner—Edward C. Kimlin
Attorney, Agent, or Firm—Henry Powers; Joseph C. Redmond, Jr.; Theodore E. Galanthay

[57] ABSTRACT

A process for forming a layer of a metallurgy interconnection system on a substrate. The process involves forming a first electrically insulative layer of an organic polymerized resin material on the substrate, forming a second thin layer on the first layer which is resistant to dry etching conditions which are effective to etch the first layer, depositing a photoresist layer on the second layer, exposing the photoresist to form an inverse pattern of a desired metallurgy pattern and developing the photoresist, reactive ion etching the resultant exposed areas of the first and second layers, depositing a blanket continuous conductive metal layer over the hills and valleys of the pattern resulting from reactive ion etching, applying a planarizing photoresist layer, etching the photoresist to expose high spots of the metal layer, and etching the metal high spots to a depth sufficient to expose the surface of the second layer.

7 Claims, 15 Drawing Figures

FIG. 1
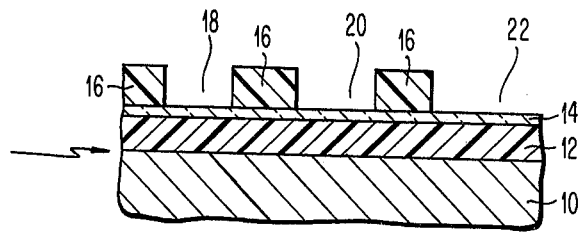
APPLY ORGANIC POLYMERIC LAYER
APPLY GLASS LAYER
APPLY AND DEVELOP PHOTORESIST
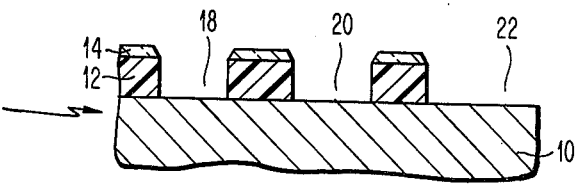
REACTIVE ION ETCH EXPOSED GLASS LAYER AND POLYMERIC LAYER
FIG. 2
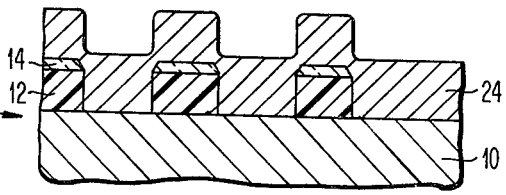
DEPOSIT METALLIC LAYER OVER ENTIRE SURFACE
FIG. 3
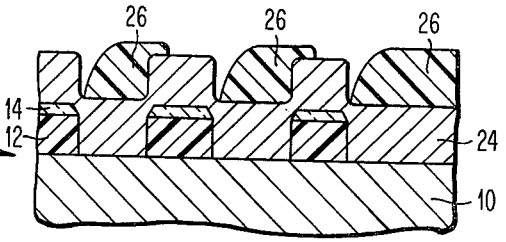
APPLY AND DEVELOP PHOTORESIST IN VALLEYS OF METALLIC LAYERS
FIG. 4
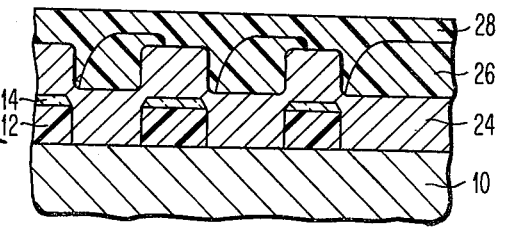
APPLY PLANAR PHOTORESIST LAYER
FIG. 5

ETCH PHOTORESIST TO EXPOSE METAL HIGH SPOTS

ETCH METAL HIGH SPOTS

REMOVE REMAINING PHOTORESIST

REPEAT ABOVE STEPS TO PROVIDE ADDITIONAL PLANAR LEVEL OF METALS

PLANAR METAL INTERCONNECTION SYSTEM AND PROCESS

BACKGROUND OF THE INVENTION

1. Field of the Invention

The present invention relates generally to a process for forming metallurgy patterns on a substrate. More particularly, the present invention relates to a process for forming a metallurgy interconnection system with a planar top surface.

2. Description of the Prior Art

Multilevel metallurgy interconnection systems for integrated circuit devices have conventionally been formed by blanket depositing a metal layer, forming a photoresist layer on the metal layer, exposing the photoresist to the desired metallurgy pattern, developing the photoresist and subsequently etching the exposed portions of the metal layer to form the first level of a desired metallurgy interconnection system. The metallurgy pattern was then covered by an insulating layer and another metallurgy pattern was formed on the surface of the insulating layer making contact to the underlying metallurgy pattern through via holes. Each time a metallurgy pattern is deposited on a surface, the more irregular or non-planar the surface of the overlying insulating layer becomes. In general, three levels of metallurgy are the maximum that can be deposited using the above described method.

An alternative method for forming metallurgy patterns is commonly denoted by the term "lift-off method". The lift-off method was initially described in U.S. Pat. No. 2,559,389. Improvements to the basic lift-off method have been made, as described in U.S. Pat. Nos. 3,849,136 and 3,873,361, all of which patents are assigned to the present assignee. The basic lift-off method for forming a metallurgy pattern does not overcome the non-planarity problem discussed heretofore.

A method for forming a planar metallurgy pattern utilizing the lift-off method is described in U.S. Pat. No. 3,985,597, assigned to the present assignee. The method of this patent involves depositing a conductive metal layer in the bottom of a trench formed in a first layer of an organic thermal setting polymerized resin material, a second overlying layer of a material that is soluble in a solvent that does not appreciably affect the material of the first layer and a third layer resistant to reactive ion etching in $O_2$. As usual with lift-off methods, the substrate is exposed to a solvent that is selective to the material of the second layer so as to lift-off the structure above the deposited metal and the first layer. Also, as common to the lift-off method, over etching of the masking layer produces an overhang of the openings in the overlying layers. The over etching is used to facilitate easy lift-off of the unwanted portions of the finally deposited layers. The use of an overhang and vertical metal deposition results in small spaces existing between the metal pattern and the surrounding organic resin material of the first layer. The use of an over hang in effect restricts the size of the metal pattern that can be deposited since the spaces formed between the metal pattern and the surrounding organic resin cannot be utilized for metal.

SUMMARY OF THE INVENTION

It is a primary object of the present invention to provide an improved method for forming metal interconnection systems having surface planarity.

It is another object of the present invention to provide an improved method for forming metal interconnection systems for integrated circuit devices which are adapted to greater component density.

It is a further object of the invention to provide an improved method for forming multi-level metal interconnection systems for integrated circuit devices which is simplified and has few critical process operations.

In accordance with the objects of this invention, the process for forming a layer of a metallurgy interconnection system on a substrate involves forming a first electrically insulative layer of an organic polymerized resin material on the substrate, forming a second thin layer of the first layer which is resistant to dry etching conditions which are effective to etch the first layer, depositing a photoresist layer on the second layer, exposing the photoresist to form an inverse pattern of a desired metallurgy pattern and developing the photoresist, reactive ion etching the resultant exposed areas of the first and second layers, depositing a blanket continuous conductive metal layer over the hills and valleys of the pattern resulting from reactive ion etching, applying a planarizing photoresist layer, etching the photoresist to expose high spots of the metal layer, and etching the metal high spots to a depth sufficient to expose the surface of the second layer.

BRIEF DESCRIPTION OF THE DRAWINGS

The foregoing and other objects, features and advantages of the invention will become apparent from the following more particular description of preferred embodiments of the invention as illustrated in the accompanying drawings, wherein:

FIGS. 1-8 illustrate a sequence of elevational views in broken section illustrating a substrate at various stages during the practice of the method of the invention.

DESCRIPTION OF THE PREFERRED EMBODIMENTS

Figure 6:
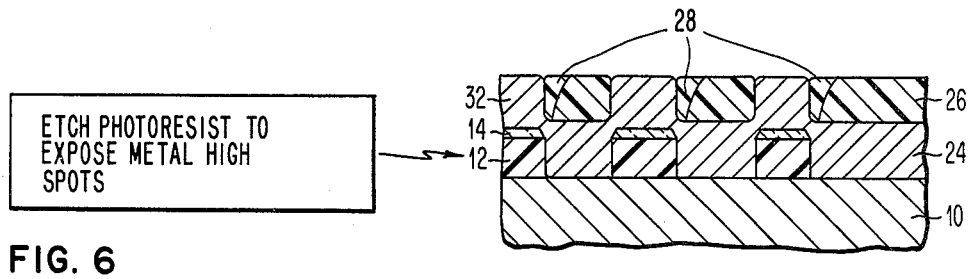

Referring now to the drawings, as illustrated in FIG. 1, a first electrically insulative layer 12 of an organic polymerized resin material is formed on a substrate 10.

The resin material of layer 12 can be any suitable resin material that will adhere to layer 10 and which can be reactive ion etched with a suitable reactive ion, such as $O_2$. If necessary or desirable, the surface of layer 10 can be treated to insure adhesion of layer 12. A preferred resin material for use as layer 12 is a polyimide plastic material. An example of such a resin material is commercially available under the tradename of RC5878 by E. I. duPont de Nemours and Co. The polyimide is formed by reacting pyrometallic di-anhydride with an aromatic diamine which yields a polyamic acid. The polyamic acid is thermally crosslinked in situ.

A preferred technique for forming layer 12 is to deposit a resin material in liquid form on substrate 10 and then spinning substrate 10. The spinning action flows the material over the surface of the wafer to a relatively uniform thickness. The resin material is subsequently heated to dehydrate and cure the resin material. Suitable curing of polyimide is accomplished by heating the polyimide for 20 minutes at 80° C. which removes the solvent from the material thereafter heating for 10 minutes at 200° C. causes imidization. Additional heating for 20 minutes at 310° C. causes the polyimide to crosslink. In general, any organic polymeric material can be used for layer 12 which is susceptible to reactive ion etching by an ambient ion which does not etch substrate 10 and which has suitable dielectric properties. Other suitable materials for use as layer 12 include those which are stable at temperatures up to about 400° C., such as halogenated, nitrogenated and oxygenated polymers, polyaliphatic and polyaromatic polymers formed by conventional or plasma polymerization. In general, the material to be used should have a high temperature stability of over 400° C. and have a suitable viscosity such that it will flow during the deposition and to a small extent during the curing cycle. The thickness of layer 12 is controlled by the viscosity of the material deposited on the wafer and the rate at which it is spun during the deposition. Typically a desirable thickness is in the range of from about 1 to about 5 microns, preferably from about 1 to 2 microns when used in integrated circuit interconnection metallurgy application.

The substrate 10 is typically monocrystalline silicon or other semiconductor material having active and passive devices fabricated therein (not shown) and means for electrically isolating the devices from each other. The surface of substrate 10 in contact with the first layer 12 is either silicon or other semiconductor material, silicon compounds, metal or an inorganic insulating material, such as aluminum oxide. Each of these components of substrate 10 is impervious to attack by reactive ion etching with $O_2$ and in a subsequently described step acts as an etch stop during reactive ion etching of layer 12 with $O_2$ or other suitable ambient.

Next a thin film of glass 14 is deposited atop layer 12. Glass film 14 acts as a mask for the subsequent etching of layer 12. Thus, glass film 14 may be made very thin, however, the thickness of glass film 14 is not critical. Typically, glass film 14 is from about 0.3 to about 0.7 microns. Since layer 12 of an organic thermal setting polymerized resin material is damaged at temperatures above about 400° C., glass film 14 is deposited by methods wherein the temperature does not exceed about 400° C. Suitable methods for depositing glass film 14 include low temperature chemical vapor deposition, plasma enhanced chemical vapor deposition and plasma enhanced polymerization. As used herein, the term "glass" includes silicon dioxide, silicon oxide, silicon nitride and other compounds commonly used as insulators or passivators. It should be understood that any glass material can be used which is resistant to being etched in the ambient used for the final reactive ion etching of layer 12.

A layer of photoresist 16 is then applied over the glass layer 14. As shown in FIG. 1, photoresist layer 16 has been exposed and developed to provide windows 18, 20 and 22 through which the surface of glass layer 14 is exposed.

Photoresist layer 16 may be any conventional optical or electron resist but is preferably a resist which may be exposed by an electron beam. In addition to PMMA and its copolymers which are a positive electron resist material, any number of sensitive electron or optical resists may be used. For example, the positive resists marketed by the Shipley Company under the tradename of AZ-1350H, AZ-1350J and AZ-111 and the negative resist marketed by the Kent Hunt Chemical Company identified by the tradename Waycoat IC and by the Eastman Kodak Company under the tradenames of KTFR, KMER, KPR-2 and KPR-3 may be used. The techniques for applying, exposing and developing these resists either by electron beam or ultra-violet light are well known to those skilled in the art.

Figure 10:
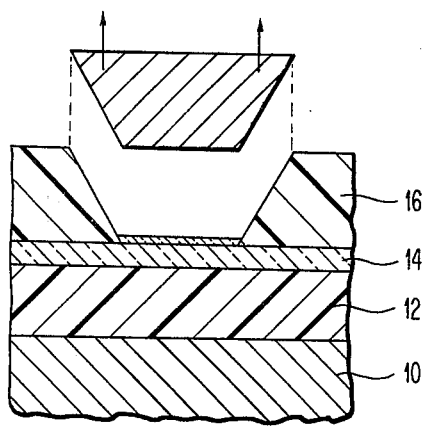
FIG. 10 is an enlarged elevational view in broken section of one contact opening shown in FIG. 2 illustrating various features of the reactive ion etching step.

Glass layer 14 and polymerized resin layer 12 are then etched as shown in FIG. 2. A preferred technique for removing glass layer 14 and resin layer 12 to form vertical trenches is by reactive ion etching. In reactive ion etching, the substrate is exposed to a reactive ion plasma generated in an appropriate ambient by an RF or DC power source. Suitable apparatus for performing reactive ion etching is illustrated in U.S. Pat. No. 3,598,710. Preferably, the reactive ion etching step is initiated in an ambient of $O_2$ and/or $CF_4$. As best seen in the enlarged view of FIG. 10, a residue of photoresist sometimes may remain over the surface of glass layer 14 after removal of the illustrated cross hatched portion of photoresist by conventional exposure and development. A short treatment in an ambient of $O_2$ for about 60 seconds is sufficient to remove any remaining photoresist over glass layer 14.

Figure 11:
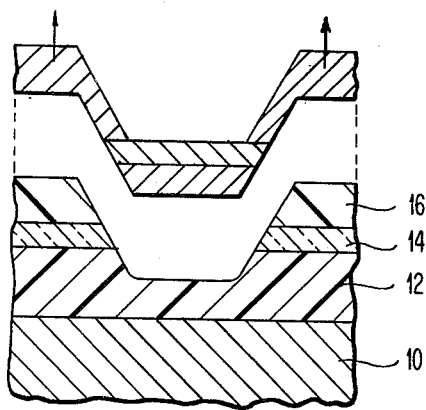
FIG. 11 is similar to FIG. 10 illustrating further features of the reactive ion etching step.
Figure 12:
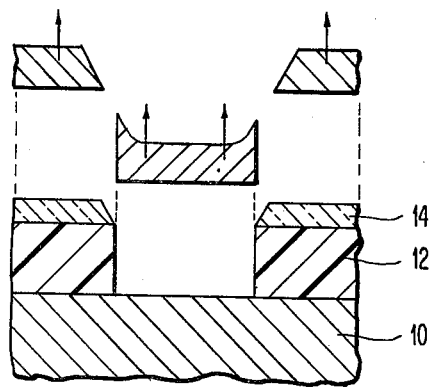
FIG. 12 is similar to FIG. 11 illustrating further features of the reactive ion etching step.

Removal of the exposed portions of glass layer 14 is preferably achieved by an ambient consisting of $CF_4$. A pressure of 5 millitorr and a power density of 0.3 watts/$cm_2$ is suitable. Glass layer 14 is etched away in a few minutes but the $CF_4$ ambient is retained until approximately half of the resin layer 12 is removed. As shown in FIG. 11 the material removed by reactive ion etching with a $CF_4$ ambient is cross hatched. As can be seen, some of the polymerized resin layer 12 and the glass layer 14 are removed as well as most of the photoresist layer 16 during reactive ion etching with $CF_4$ ambient. At this point, the ambient in the etching chamber is changed to an ambient which will not etch either glass layer 14 or substrate 10 and the illustrated cross hatched portion of layer 12 is removed as shown in FIG. 12. The preferred ambient when glass layer 14 is silicon dioxide is oxygen. Other suitable ambients include a mixture of oxygen, argon, nitrogen and halogenated compounds. During the final reactive ion etching with an $O_2$ or other suitable ambient the remainder of the photoresist layer 16 is also removed as shown in FIG. 12.

The requirement that glass layer 14 be resistant to the ambient used in the final reactive ion etching step is now apparent. As shown in FIG. 12, final reactive ion etching proceeds vertically from the end of glass layer 14 remaining after a contact opening in glass layer 14 is formed by reactive ion etching with CF$_4$. The surface of the substrate 10 acts as an etch stop for reactive ion etching with O$_2$. Consequently, it is preferred that etching in an O$_2$ ambient be continued about 30 per cent longer than a perceived end point. This assures that all of the polymerized resin layer 12 has been removed. Preferably, reactive ion etching in an O$_2$ ambient is accomplished at a pressure of 4 millitorr of O$_2$ at a power density of 0.1 watts/cm$^2$. As shown in FIG. 2 and FIG. 11, the sidewalls of the openings 18, 20 and 22 are vertical.

As shown in FIG. 3, a metallic layer 24 is then deposited on the resultant surface of the substrate 10. Metallic layer 24 is deposited at sufficient thickness so that a blanket continuous layer of metal is formed across the surface of substrate 10. Due to the uneven topography of the surface of substrate 10 resulting from reactive ion etching of resin layer 12 and glass layer 14, the blanket continuous metallic layer 24 is deposited as a series of hills and valleys as shown in FIG. 3. In general, the thickness of metallic layer 24 should be at least equivalent to the thickness of resin layer 12 plus the thickness of glass layer 14. Preferably, the metallic layer 24 is deposited at a thickness equivalent to layer 12 and glass layer 14 plus a slight increment of from about 5 to about 25 percent of the combined thickness of resin layer 12 and glass layer 14. This assures a continuous band of metal at the top edges of the trench formed by reactive ion etching.

Metallic layer 24 of conductive material can be any suitable type of material such as aluminum, aluminum copper alloy, molybdenum, tantalum, or laminated combinations such as chromium-silver-chromium, molybdenum-gold-molybdenum, chromium-copper-chromium, and the like.

A planar layer of photoresist is then applied. In a preferred embodiment of the invention, as shown in FIG. 4, the valleys in the metallic layer 24 are first filled with photoresist 26. Filling of the valleys of metallic layer 24 is essential only when the device structure has large etched areas. The reason for this is that large etched areas containing metal would contain a height of a blanket layer of photoresist insufficient to protect the desired portions of the metal during a subsequent etch step to expose the metal high spots as described hereinafter. Application of photoresist to the valleys of the metal does not require critical masking and as shown in FIG. 4 some misalignment is allowed. The misalignment can be quite large and bridging is also acceptable for this step. If the same mask used to expose the photoresist layer 16 is used for the step illustrated in FIG. 4 of applying photoresist in the metallic layer valleys, it is necessary to use a negative photoresist. Alternatively, a negative of the mask used to expose photoresist layer 16 can be prepared and a positive photoresist can be used to fill the valleys of metallic layer 24.

Figure 13:
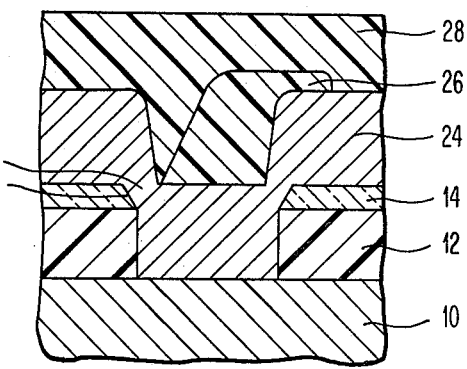
FIG. 13 is an enlarged elevational view in broken section of one contact opening of FIG. 6 after application of a metal layer and a photoresist layer.

Next, as shown in FIG. 5 a blanket photoresist layer 28 is applied to the substrate 10 to form a planar photoresist layer. The photoresist layer 28 can be applied directly to the substrate without applying layer 26 to fill the valleys of the metallic layer 24 if the device consists solely of small metal lines. Planar photoresist layer 28 can be any suitable type of photoresist. One contact opening showing the relationship of the layers is shown in FIG. 13.

Figure 14:
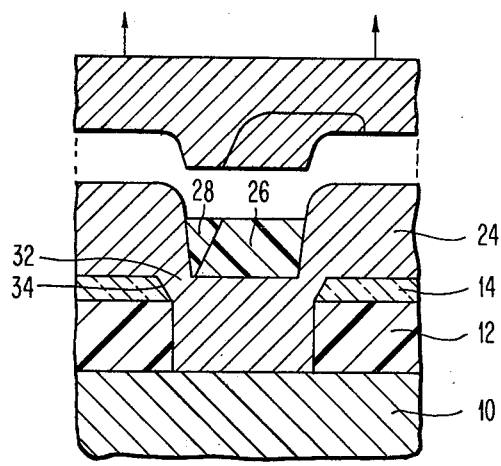
FIG. 14 is similar to FIG. 13 and illustrates various features of the metal etching step.

Photoresist layer 28 and photoresist layer 26 (if used) is then subjected to a blanket etch to expose the hills of metallic layer 24. As shown in FIG. 14, the exposed metal high spots have residues of photoresist layer 28 and photoresist layer 26 residing in the valleys between the hills. Preferably, the photoresist layer 28 and 26 is etched with a reactive ion etching ambient consisting of 92 percent CF$_4$ and 8 percent O$_2$. The etching is preferably continued until the photoresist has been removed to a level of from about 0.1 to about 0.4 microns beneath the surface of the metal high spots. The photoresist removed is illustrated as cross hatched in FIG. 14.

The exposed metal high spots are then wet etched to remove the metal which extends above glass layer 14. Wet etching is effected with suitable reagents in accordance with conventional methods. For example, an aluminum-copper alloy can be etched with a mixture of phosphoric and nitric acids at 35°±5° C.

Figure 15:
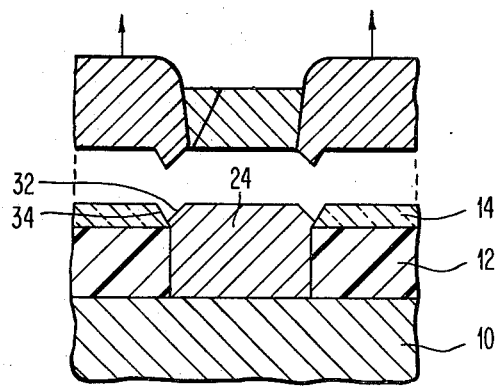
FIG. 15 is an enlarged elevational view in broken section similar to FIG. 14 illustrating the relationship of the components in a finished metallurgy pattern.

The wet etch step is continued until all of the metal above glass layer 14 has been removed and is continued for an additional time to remove a portion of the metal neck 32 which extends between the inclined leading edge 34 of glass layer 14 and remaining photoresist layers 28 and 26. The material removed during the wet etch step is illustrated as cross hatched in FIG. 15. The neck 32 permits the wet etch step to proceed in a non-critical manner as the wet etch step is stopped while the metal still contacts the leading edge 34 of glass layer 14. Stopping the wet etch step while metal still contacts leading edge 34 permits the organic polymeric resin layer 12 to be fully enclosed by a combination of glass layer 14, the metal remaining after the wet etch step and substrate 10. This is of great significance since it isolates the organic resin material which is susceptible to moisture pickup. A further advantage is that the encapsulated resin material will not be susceptible to etching during reactive ion etching when subsequent layers of metallization are applied.

Figure 7:
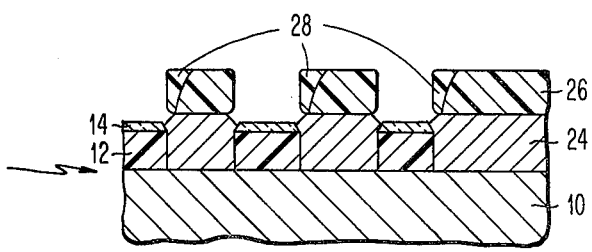
Figure 8:
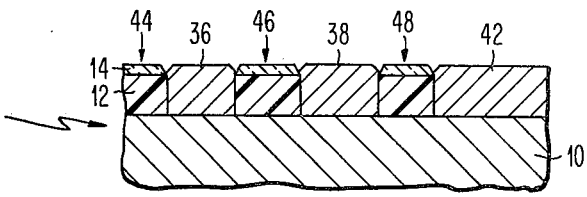

After the wet etch step is concluded the structure shown in FIG. 7 is attained. The remaining photoresist is then removed to provide the structure of FIG. 8 having a first level of planar metal. The structure shown in FIG. 8 has metal segments 36, 38 and 42 separated by passivation sections 44, 46 and 48.

Figure 9:
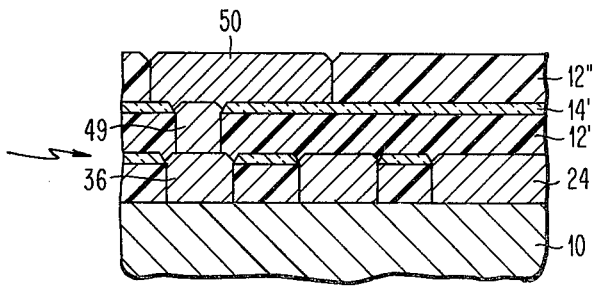
FIG. 9 is an elevational view in broken section illustrating the structure formed in FIGS. 1-8 with additional metallurgy layers formed in accordance with the method of the invention by repeating the steps illustrated in FIGS. 1-8.

As will be apparent to those skilled in the art any desired number of interconnection layers can be formed by repeating the method steps illustrated in FIGS. 1-8. FIG. 9 illustrates a finished structure after two further sequences of steps as described above to provide two additional layers of metallurgy of an interconnection pattern. As shown in FIG. 9 a via stud 49 connects metal portion 36 with metal portion 50. Additional layers of the same material are marked with the reference numbers previously described using a prime or double prime notation. As the layers are built up the surface of the interconnection pattern and the insulating material surrounding the metallurgy interconnection pattern remains substantially planar. This permits the number of layers to be increased without regard to the problems which occur when the surfaces are not planar.

While the invention has been particularly shown and described with reference to the preferred embodiments thereof, it will be understood by those skilled in the art that the foregoing and other changes in form and detail may be made without departing from the spirit and scope of the invention.

What is claimed is:

1. A process for forming an interconnection metallurgy system on a substrate comprising:

forming a first layer of an organic polymerized resin material on the top surface of said substrate;

forming a second overlying glass layer on the surface of said resin layer, depositing a resist layer over said second layer, exposing the resist to form the pattern of the desired metallurgy pattern and developing the resist;

removing the resultant exposed areas of said first and said second layer by reactive ion etching, depositing over said substrate a blanket continuous conductive metal layer, said metal layer having a hill and valley configuration conforming to the topography on the surface of said substrate;

applying a blanket layer of photoresist;

etching said photoresist layer to expose high spots of said metal layer; and etching said metal high spots to remove metal above said second layer.

2. A process in accordance with claim 1 wherein said conductive metal layer has a thickness at least equal to that of said first and said second layer.

3. A process in accordance with claim 1 wherein said metal layer has a thickness of at least from about 5 to about 25 percent in excess of the thickness of said first and said second layer.

4. A method in accordance with claim 1 or claim 2 wherein said photoresist layer which is applied to the surface of said metal layer is etched to a level of from about 0.1 to about 0.4 microns beneath the surface of said metal high spots.

5. A method in accordance with claim 1 wherein said etching of said metal high spots is stopped while metal remains in contact with the leading edge of said second layer.

6. A method in accordance with claim 1, 2, 4 or 5 wherein exposed areas of said first and said second layers are removed by a reactive ion etching step including a first reactive ion etching in an ambient comprising $CF_4$ and a second reactive ion etching step in an ambient comprising $O_2$ so as to provide a vertical trench pattern in said first layer.

7. A method in accordance with claim 1, 2, 4 or 5 wherein said blanket layer of photoresist is applied by a process wherein a first layer of photoresist is applied through a mask into the valleys of said metal layer and a second blanket layer of photoresist is applied in a planar configuration.

* * * * *

UNITED STATES PATENT AND TRADEMARK OFFICE
CERTIFICATE OF CORRECTION

PATENT NO. : 4,307,179
DATED : December 22, 1981
INVENTOR(S) : Kenneth Chang et al.

It is certified that error appears in the above-identified patent and that said Letters Patent are hereby corrected as shown below:

Column 3, line 10, delete "pyrometallic" and insert therefor --pyromellitic--.

Signed and Sealed this

Twenty-fourth Day of August 1982

|SEAL|

Attest:

GERALD J. MOSSINGHOFF

Attesting Officer — Commissioner of Patents and Trademarks